United States Patent
Tsau et al.

(10) Patent No.: US 9,102,512 B2
(45) Date of Patent: Aug. 11, 2015

(54) SEALED MEMS DEVICES WITH MULTIPLE CHAMBER PRESSURES

(71) Applicant: Analog Devices, Inc., Norwood, MA (US)

(72) Inventors: Christine H. Tsau, Medford, MA (US); Li Chen, Belmont, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/045,855

(22) Filed: Oct. 4, 2013

(65) Prior Publication Data

US 2015/0097253 A1    Apr. 9, 2015

(51) Int. Cl.
*H01L 29/84* (2006.01)
*B81B 7/00* (2006.01)
*B81C 1/00* (2006.01)

(52) U.S. Cl.
CPC ........... *B81B 7/0038* (2013.01); *B81C 1/00285* (2013.01); *H01L 29/84* (2013.01); *B81B 2201/0228* (2013.01)

(58) Field of Classification Search
CPC ............. B81B 7/0028; B81B 2201/0228; B81C 1/00385; H01L 29/84
USPC .......................................... 257/415, 416, 704
See application file for complete search history.

(56) References Cited

U.S. PATENT DOCUMENTS

| | | | |
|---|---|---|---|
| 5,591,679 A | 1/1997 | Jakobsen et al. | 437/228 |
| 6,505,511 B1 * | 1/2003 | Geen et al. | 73/504.12 |
| 7,017,411 B2 * | 3/2006 | Geen et al. | 73/514.13 |
| 7,075,160 B2 | 7/2006 | Partridge et al. | 257/414 |
| 7,102,220 B2 | 9/2006 | Stevens et al. | 257/686 |
| 7,314,777 B2 | 1/2008 | DCamp et al. | 438/106 |
| 7,449,355 B2 * | 11/2008 | Lutz et al. | 438/50 |
| 7,571,992 B2 | 8/2009 | Jia et al. | 347/70 |
| 7,595,209 B1 * | 9/2009 | Monadgemi et al. | 438/51 |
| 7,605,466 B2 | 10/2009 | Aimi et al. | 257/723 |
| 7,736,946 B2 | 6/2010 | Seppala et al. | 438/106 |
| 7,763,962 B2 * | 7/2010 | Pan et al. | 257/682 |
| 7,875,482 B2 | 1/2011 | Candler et al. | 438/51 |
| 8,035,209 B2 | 10/2011 | Gonska et al. | 257/682 |
| 8,058,144 B2 * | 11/2011 | Bhagavat et al. | 438/456 |
| 8,350,346 B1 | 1/2013 | Huang et al. | 257/415 |
| 8,372,676 B2 | 2/2013 | Lutz et al. | 438/50 |
| 2006/0246631 A1 * | 11/2006 | Lutz et al. | 438/127 |
| 2009/0294879 A1 * | 12/2009 | Bhagavat et al. | 257/415 |
| 2010/0025845 A1 | 2/2010 | Merz et al. | 257/723 |
| 2010/0068854 A1 * | 3/2010 | Schirmer et al. | 438/125 |
| 2010/0139373 A1 * | 6/2010 | Braman et al. | 73/40.7 |
| 2012/0043627 A1 | 2/2012 | Lin et al. | 257/415 |
| 2012/0326248 A1 | 12/2012 | Daneman et al. | 257/415 |

* cited by examiner

*Primary Examiner* — Nikolay Yushin
(74) *Attorney, Agent, or Firm* — Sunstein Kann Murphy & Timbers LLP

(57) ABSTRACT

A MEMS apparatus has a substrate, a cap forming first and second chambers with the base, and movable microstructure within the first and second chambers. To control pressures, the MEMS apparatus also has a first outgas structure within the first chamber. The first outgas structure produces a first pressure within the first chamber, which is isolated from the second chamber, which, like the first chamber, has a second pressure. The first pressure is different from that in the second pressure (e.g., a higher pressure or lower pressure).

20 Claims, 4 Drawing Sheets

SEALED MEMS DEVICES WITH MULTIPLE CHAMBER PRESSURES

FIELD OF THE INVENTION

The invention generally relates to MEMS devices and, more particularly, the invention relates to controlling pressures within MEMS devices.

BACKGROUND OF THE INVENTION

Microelectromechanical systems ("MEMS" or "MEMS devices") are used in a growing number of applications. For example, MEMS devices often are implemented as gyroscopes to detect pitch angles of airplanes, and as accelerometers to selectively deploy air bags in automobiles. In simplified terms, such MEMS devices typically have a fragile structure suspended above a substrate, and associated circuitry that both senses movement of the suspended structure and delivers the sensed movement data to one or more external devices (e.g., an external computer). The external device processes the sensed data to calculate the property being measured (e.g., pitch angle or acceleration).

To protect their fragile structure, MEMS devices typically have some type of protective apparatus, such as a package. Specifically, MEMS devices often have a package that seals the structure within a protective chamber. The package often is a first, second, or third level package. If the package is properly sealed, environmental contaminants should not interfere with or damage the structure. Some MEMS devices also seal a gas within the chamber to further optimize device performance.

Many MEMS devices are packaged to have one cavity—i.e., a single cavity containing a one or more suspended masses. Others, however, have multiple cavities with one or more masses that have different functions. As such, those different cavities may have different pressure requirements. For example, a first cavity having a low-G accelerometer may operate better under a vacuum or low pressure, while a second cavity (of the same MEMS device) having a high-G accelerometer may perform better at atmospheric or higher pressures. Efficiently and effectively fabricating the MEMS device with different pressures has been a continuing challenge.

SUMMARY OF VARIOUS EMBODIMENTS

In accordance with one embodiment of the invention, a MEMS apparatus has a substrate, a cap forming first and second chambers with the base, and movable microstructure within the first and second chambers (e.g., one or more movable masses within each chamber). To control pressures, the MEMS apparatus also has a first outgas structure within the first chamber. The first outgas structure produces a first pressure within the first chamber, which is isolated from the second chamber, which, like the first chamber, has a second pressure. The first pressure is different from that in the second pressure (e.g., a higher pressure or lower pressure).

In a manner similar to the first chamber, the second chamber may have a second outgas structure. For example, the first outgas structure and second outgas structure may have different outgas rates per unit volume. To further vary pressures, the MEMS device may have a getter material within the second chamber, or the second chamber may be substantially free of an outgas structure. The first pressure may be greater than the second pressure.

The first chamber may have a surface, and the first outgas structure may be positioned on a surface of the first chamber to cover at least a portion of that surface. Moreover, the substrate may support the microstructure within the first chamber, which also can have a top portion, formed by the cap and opposed to the microstructure. The first outgas structure may be positioned on at least a part of the top portion of the first chamber. Alternatively or in addition, the first chamber may have a cavity containing the first outgas structure. In some implementations, the cap includes a package lid and the substrate includes a package base.

In accordance with another embodiment, a MEMS apparatus has a substrate with a substrate material, a cap forming first and second sealed chambers with the base and having a cap material, and securing material connecting the cap with the substrate. The MEMS apparatus also has movable microstructure within the first and second chambers, and a first outgas structure formed within the first chamber and producing a first pressure within the first chamber. The first outgas structure is formed from material that is the same as at least one of the substrate material, the cap material and the securing material. Moreover, the first chamber is isolated from the second chamber, and the second chamber has a second pressure that is different from the second pressure.

In accordance with other embodiments, a method of forming a MEMS device forms microstructure on a substrate, provides a cap, and applies first outgas material to no more than a first portion of one or both of the substrate and the cap. This outgas material forms an outgas structure. The method also secures the cap to the substrate to form first and second sealed chambers. The first chamber contains the first outgas structure, which causes the first chamber to have a pressure that is greater than the pressure of the second chamber.

In accordance with another embodiment, a method of forming a MEMS device forms microstructure on a substrate wafer, provides a cap wafer, and applies first outgas material to no more than a first portion of one or both of the substrate wafer and the cap wafer. The method further secures the cap wafer to the substrate wafer in an environment having a single pressure. The substrate wafer and cap wafer thus form an array of MEMS chips, where some or all of the MEMS chips have first and second sealed hermetic chambers. The first chamber contains the first outgas material. The method further dices the array of MEMS chips to form a plurality of individual MEMS chips. A plurality of the chambers maintain hermeticity through dicing. Moreover, the first outgas material causes the first chamber to have a pressure that is greater than the pressure of the second chamber after the cap is secured to the substrate.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, a MEMS device has multiple chambers that each has different steady-state pressures. To produce the noted pressure difference, illustrative embodiments form one or more outgas structures within one or both of the chambers. Moreover, use of the outgas structure enables the MEMS device to have this differential pressure without requiring subsequent steps to vary the pressure. Accordingly, because it reduces number of the steps of a multi-step process, use of the outgas structure reduces fabrication complexity and cost. Details of illustrative embodiments are discussed below.

Figure 1:
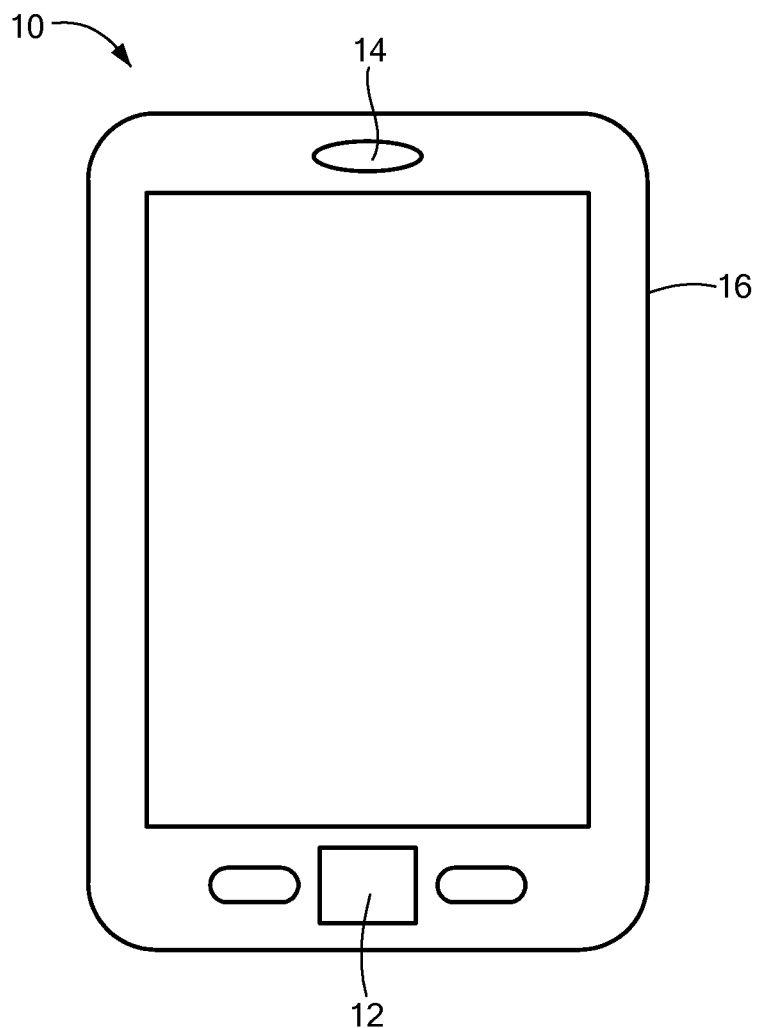
FIG. 1 schematically shows a device that may use a MEMS device configured in accordance with illustrative embodiments of the invention.

FIG. 1 schematically shows a smartphone 10 that can incorporate packaged MEMS devices configured and produced in accordance with illustrative embodiments. It should be noted, however, that discussion of a smartphone 10 and its various components is for illustrative purposes only and thus, not intended to limit all embodiments of the invention. Various embodiments thus apply to other types of devices, such as, among other things, automobiles, mobile telephones, tablets, personal digital assistants ("PDAs"), game handsets and consoles, headsets, computers, hand-held MEMS device systems, televisions, radios, etc.

In simplified terms, the smartphone 10 has a receiver 12 for receiving sound (e.g., a person's voice), a speaker portion 14 for generating sound, and internal circuitry (not shown) for transmitting and receiving electromagnetic signals encoding incoming sound. In addition, the smartphone 10 also has an internal packaged MEMS device 18 (shown in FIGS. 2A and 2B, discussed below) having at least two cavities with different pressures. For example, the packaged MEMS device 18 may implement one or more inertial sensors, such as a gyroscope and an accelerometer. Among other things, the inertial sensor(s) may be used for any of a wide variety of applications, such as navigation, photography, on/off switching, and/or compass applications. Each of these smartphone components is at least in part encased within a device housing 16 generally formed from a conventional housing material, such as glass, plastic, metal, rubber, or a combination of materials.

Figure 2A:
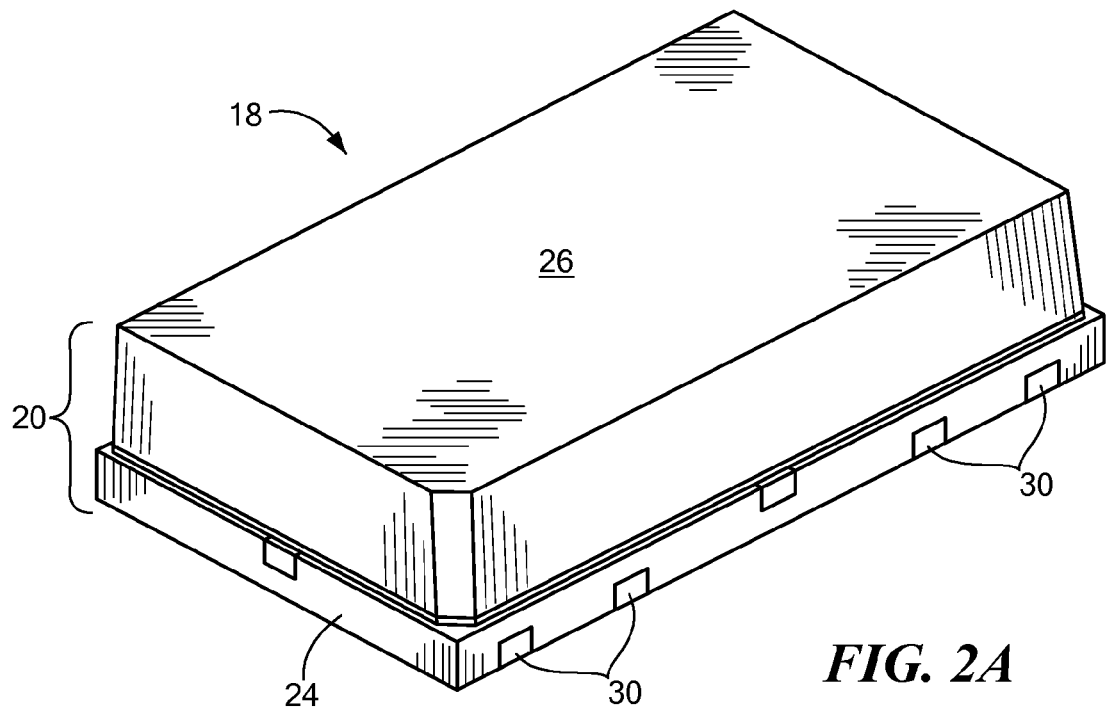
FIG. 2A schematically shows a perspective view of a packaged MEMS device using a first type of package.

FIG. 2A schematically shows a perspective view of a packaged MEMS device 18 using a first level package 20 that may be secured to some second level device or substrate (e.g., a printed circuit board within the smartphone 10). Continuing with the above example, the packaged MEMS device 18 may be a two-chamber inertial sensor apparatus. For example, as noted above, the packaged MEMS device 18 may implement the functionality of an accelerometer and a gyroscope. It should be noted that discussion of inertial sensors is for illustrative purposes only and not intended to limit all embodiments of the invention. Accordingly, numerous additional embodiments apply to other devices beyond inertial sensors.

Figure 2B:
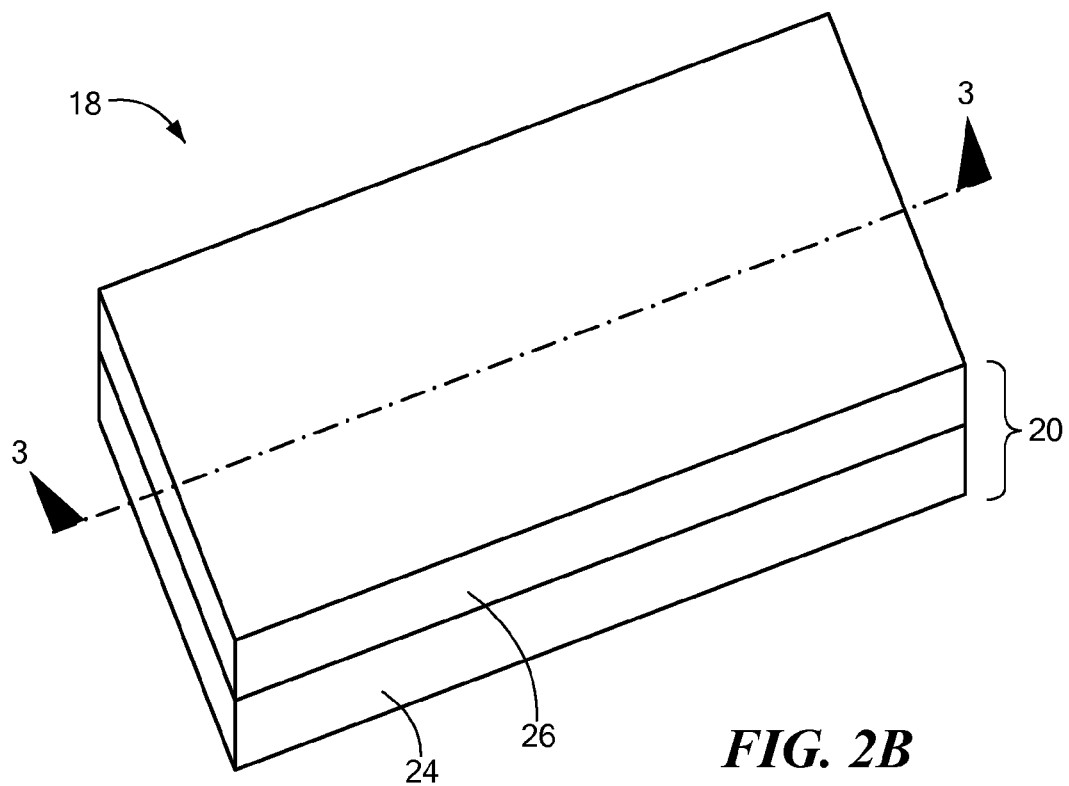
FIG. 2B schematically shows a perspective view of a packaged MEMS device using a chip-level type of package.
Figure 3A:
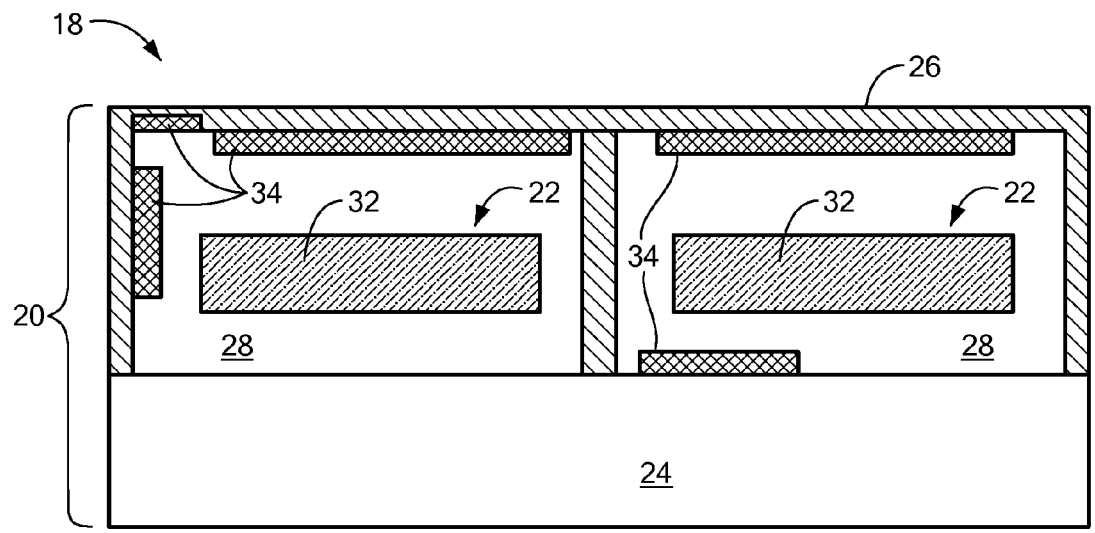
FIG. 3A schematically shows a cross-sectional view of the packaged MEMS device of FIG. 2B across line 3-3. This view shows an embodiment using an outgas structure in both MEMS chambers.
Figure 3B:
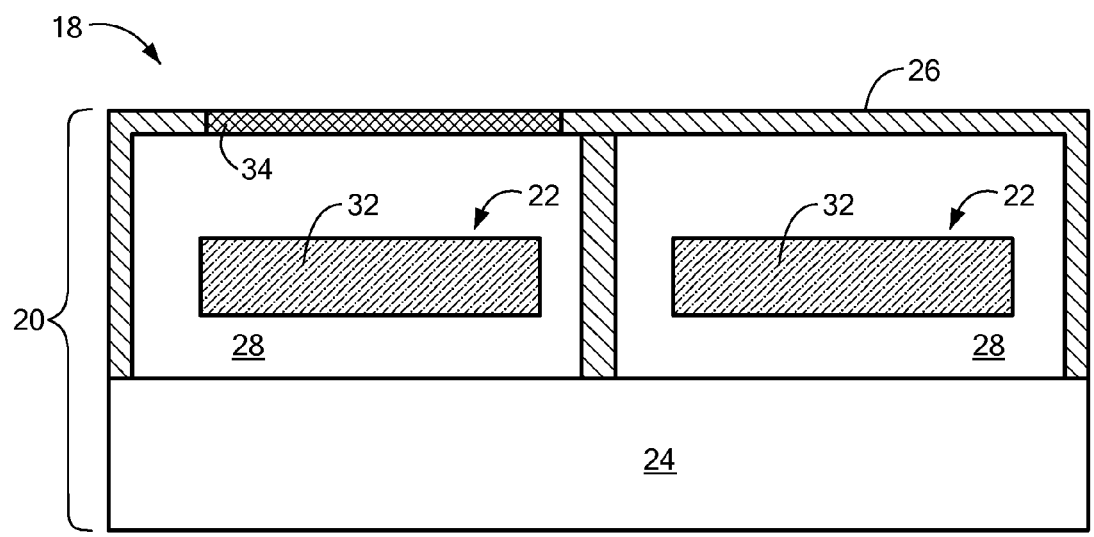
FIG. 3B schematically shows a cross-sectional view of the packaged MEMS device of FIG. 2B across line 3-3. This view shows an embodiment using an outgas structure in one of the MEMS chambers only.
Figure 3C:
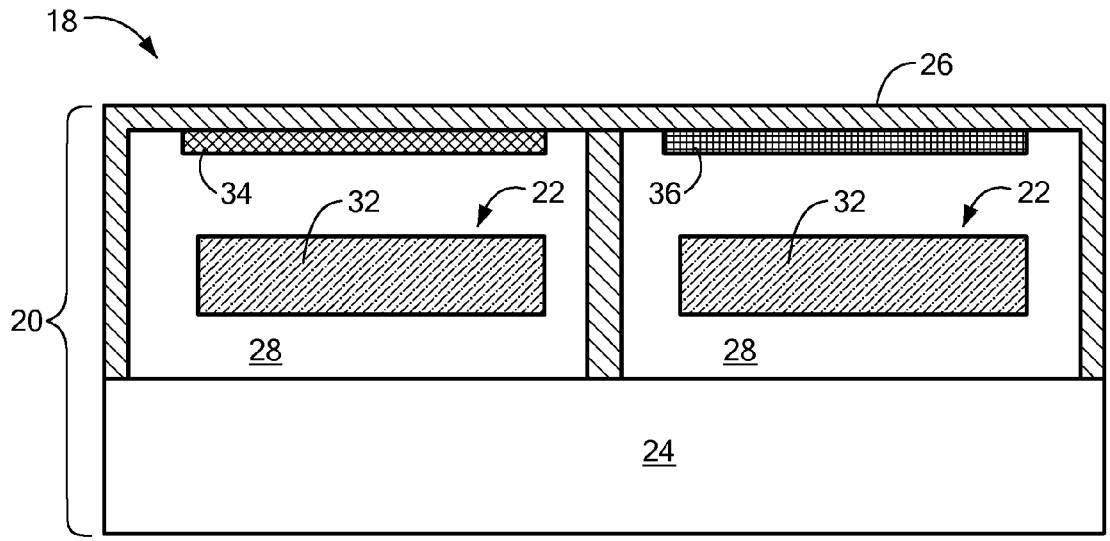
FIG. 3C schematically shows a cross-sectional view of the packaged MEMS device of FIG. 2B across line 3-3. This view shows an embodiment using an outgas structure in one MEMS chamber, and gettering material in the other MEMS chamber.

The packaged MEMS device 18 shown in FIG. 2A has a multi-chamber package 20 that each contains one or more pressure isolated MEMS chips/dice 22 for detecting inertial signals (e.g., acceleration or rotation). For example, one two-chamber embodiment has a MEMS accelerometer in one chamber (e.g., microstructure having one or more movable masses), and a MEMS gyroscope in the other chamber (e.g., microstructure having one or more movable masses). Some details of the interior of this embodiment, as well as the embodiment of FIG. 2B, are shown in FIGS. 3A-3C, which are discussed below. In addition, the package 20 also may include additional components, such as application specific integrated circuits ("ASICs," not shown) for electrically conditioning signals to and from the MEMS chips 22. Alternatively, the MEMS chip 22 has on-chip circuitry, thus obviating the need for separate MEMS device circuitry within the package 20. For example, such MEMS chips 22 may be formed as an IMEMS accelerometer distributed by Analog Devices, Inc. of Norwood, Mass. In yet other embodiments, the MEMS chip 22 has no active circuitry.

The packaged MEMS device 18 of this embodiment has a package base 24 that, together with a corresponding cap 26, forms two or more chambers containing the noted MEMS chips 22. This package 20 is a first level package that contains the MEMS chips 22 in their entireties. In this case, the cap 26 is a cavity-type lid or cover, which has a plurality of walls extending generally orthogonally from a top, interior face. The cap 26 secures to the top face of a substantially flat package base 24 to form the interior chambers 28. In alternative embodiments, the cap 26 and base 24 combine with other elements (e.g., an intervening wall between the cap 26 and the base 24) to form the interior chambers 28. Other embodiments may implement the base 24 as a cavity package (with a bottom and walls extending from a flat surface), with the cap 26 having a generally flat planar shape.

The bottom side (not shown) of the packaged MEMS device 18 has a plurality of electrical contacts 30 for electrically (and physically, in many anticipated uses) connecting the packaged MEMS device 18 with a next level substrate. For example, as noted, the next level substrate may include a printed circuit board within the smartphone 10 of FIG. 1 (e.g., a motherboard or daughterboard card), or other electrical interconnect apparatus. Among other things, the electrical contacts 30 may include surface mountable pads or leads.

Any of a number of different packaging technologies may implement the package 20 shown in FIG. 2A, such as, among other types, ceramic cavity packages, substrate packages, carriers, flex, pre-molded or post-molded leadframe packages, or laminate base (e.g., BT) packages. Accordingly, discussion of a specific type of package base is for illustrative purposes only. The base 24 and cap 26 thus can be fabricated from different, similar, or the same materials. For example, both can be formed from a laminate, or the cap 26 can be formed from a laminate, while the base 24 can be formed from a carrier or pre-molded leadframe. Illustrative embodiments select the materials to hermetically seal each of the plurality of chambers within the package 20, effectively isolating each chamber within the package 20.

FIG. 2B schematically shows a perspective view of a packaged MEMS device 18 using a chip-level type of package (i.e., a lower level package than that of the package of FIG. 2A). Accordingly, this embodiment does not require an encapsulating first level package like that shown in FIG. 2A.

Instead, this embodiment bonds its cap 26 directly to the substrate of the underlying MEMS chip to form the chambers.

To illustrate some of its interior features, FIG. 3A schematically shows a cross-sectional view of the packaged MEMS device 18 of FIG. 2B, more clearly detailing its specific components. In particular, the packaged MEMS device 18 has the MEMS chip 22, which has a substrate 24 supporting movable MEMS microstructure 32 (e.g., a plurality of movable masses). In illustrative embodiments, the MEMS chip 22 is implemented as a gyroscope and/or accelerometer. Exemplary MEMS gyroscopes are discussed in greater detail in U.S. Pat. No. 6,505,511, which is assigned to Analog Devices, Inc. Exemplary MEMS accelerometers are discussed in greater detail in U.S. Pat. No. 5,939,633, which also is assigned to Analog Devices, Inc. The disclosures of U.S. Pat. Nos. 5,939,633 and 6,505,511 are incorporated herein, in their entireties, by reference.

As noted above, the cap 26 secures directly to the substrate 24 (in this case, the substrate 24 is the base 24) to form a wafer level or chip level package. The cap 26 is specially configured, however, so that when secured to the substrate 24, it forms two or more isolated chambers 28 as discussed above. In other words, each chamber 28 can have a different pressure. In fact, some embodiments have three, four, or even more chambers 28. All those chambers 28 can have different pressures. Alternatively, two or more of a first set of chambers 28 can have the same pressures, while a second set of the chambers 28 can have pressures that are different than those of the first set.

Those skilled in the art can form the cap 26 of FIG. 2B from any of a variety of conventional techniques. For example, the cap 26 can be formed from a bulk silicon wafer. Other embodiments implement the cap as an ASIC, which has active circuitry. Silicon-on-insulator technology also may be feasible in some applications. In either case, every cap has multiple regions, some of which may be etched to form the cap 26 shown in FIG. 2B. Each of those etched regions ultimately forms one of the chambers 28 of the packaged MEMS device 18. Other embodiments can use a flat cap 26 that rests on walls extending upwardly from the substrate 24.

In accordance with illustrative embodiments of the invention, the chambers 28 formed by either embodiment of FIGS. 2A and 2B contain an outgas structure 34, exposed to one or more chambers 28, to vary the pressures in each chamber 28 when in the steady state (i.e., varying pressure at some time after fabrication, such as during anticipated use in a real application). More specifically, after careful selection and calculation, the material forming the outgas structure 34 is selected and applied in a manner that precisely controls the pressure in each chamber 28 to those pressures required by the specific application. As a result, the outgas structure 34 produces a precise increase in the chamber pressure to levels commensurate with the application.

For example, a low G accelerometer or gyroscope may operate best under a vacuum or low-pressure, while a high G accelerometer may perform better at atmospheric pressure or higher pressures. A packaged MEMS device 18 having both MEMS chips 22 in separate chambers 28 thus may form the outgas structure 34 within the chamber 28 having a high G accelerometer, while the chamber 28 with the low G accelerometer may be formed with a smaller outgas structure 34, or no outgas structure 34. Standard pressure varying processes known to the inventors require multiple steps after the chambers 28 are sealed to increase the pressure. In addition to delaying the fabrication process, these extra steps risk damaging the fragile MEMS microstructure 32. The outgas structure 34 eliminates the need for these extra steps.

In particular, the specific outgas structure parameters, such as the material type, concentration, position, application, and amount, is selected for each chamber 28 to ensure that its underlying MEMS chip 22 operates at the desired operating pressure. Other parameters, such as the cavity volume, significantly influence the pressure. Those skilled in the art can select the appropriate parameters. For example, the outgas structure 34 may be formed from the same materials as any of the materials already in the packaged MEMS device 18 that are performing other functions. Specifically, the outgas structure 34 can be formed from the same material as that of its substrate 24, cap 26, microstructure 32, or bonding material that bonds the cap to the substrate. As such, in this example, the outgas structure 34 can be formed from an oxide, a nitride, a metal, a seal glass, a polymer, or other relevant material having outgas properties consistent with the desired application. Alternatively, the outgas structure 34 can be formed from a material not already used within the packaged MEMS device 18. In either case, other than the pressure they produce, the material forming the outgas structure 34 preferably is selected to have no more than a negligible interaction with the MEMS chips 22; i.e., the material forming the outgas structure 34 preferably is substantially inert.

FIG. 3A thus shows the two chamber packaged MEMS device 18 having the outgas structure 34 within both chambers 28. Specifically, the chamber 28 on the left side of the drawing has the outgas structure 34 on the sidewall and the top surface of the chamber 28—integrated with the cap 26 in this embodiment. In addition, the left side chamber 28 has some of its outgas structure 34 formed on the surface of the cap 26—directly above the movable microstructure 32 (from the perspective of the drawing). The left side chamber 28 has an additional outgas structure 34 embedded within the cap 26. The chamber 28 on the right side of the packaged MEMS device 18, however, has less outgas structure 34. In addition, this embodiment also has one outgas structure 34 on the substrate 24. As noted above, the parameters of the outgas structure 34 are selected to produce the desired pressures. For example, each chamber 28 could have a differently configured outgas structure 34 having different outgas same rates per unit volume, or the same outgas structure 34. In addition, one chamber 28 could have thicker outgas structure(s) 34, irregularly shaped outgas structure(s) 34 (e.g., a wavy or irregular application), or more chamber surface area coverage, than that in the other chamber 28. Some such embodiments may form a single outgas structure 34 that spans both chambers 28.

Illustrative embodiments may omit all outgas structures 34 from one or more of the chambers 28. FIG. 3B schematically shows one example of a multi-chamber packaged MEMS device 18 in which the chamber 28 to the left has an outgas structure 34, while the chamber 28 to the right has no outgas structure(s) 34.

Alternatively, some embodiments may reduce the pressure—namely below that pressure within the wafer bonding chamber used to bond the substrate 24 and cap 26 at fabrication. To that end, those embodiments may add a gettering material 36 within one or more chambers 28 to balance the outgas structure 34, or to provide lower/reduced pressures (e.g., in a chamber with no outgas structure 34). FIG. 3C schematically shows one embodiment of such a design in which the chamber 28 to the left has an outgas structure 34, while the chamber 28 to the right has gettering material 36. Indeed, those skilled in the art can include gettering material 36 in one chamber 28 only, two chambers 28, or any number of chambers 28 required by the application.

The designs of FIGS. 3A-3C share a number of common traits. For example, each embodiment includes the standard components for forming the packaged MEMS device 18, such as the substrate 24, the cap 26, the movable microstructure 32, layers remaining from sacrificial etches, electric traces, isolation trenches in the MEMS chip 22, material for bonding the cap 26 to the substrate 24, etc. Some of those components may emit a gas that can impact internal pressures. Taking those inherent pressures into account, the inventors have developed an additional element—an independent outgas structure 34—that primarily increases the pressure within the chamber 28.

Unlike the noted components already in the packaged MEMS device 18, each such outgas structure 34 serves no other primary purpose, such as securing the cap 26 to the substrate 24, or supporting the movable microstructure 32. Instead, the outgas structures 34 are carefully selected and configured to control internal pressures—even in those embodiments where they are formed from the same material as some of the other components within the packaged MEMS device 18 itself. In other words, the outgas structures 34 should be considered to be separate components of the overall packaged MEMS device 18.

Figure 4:
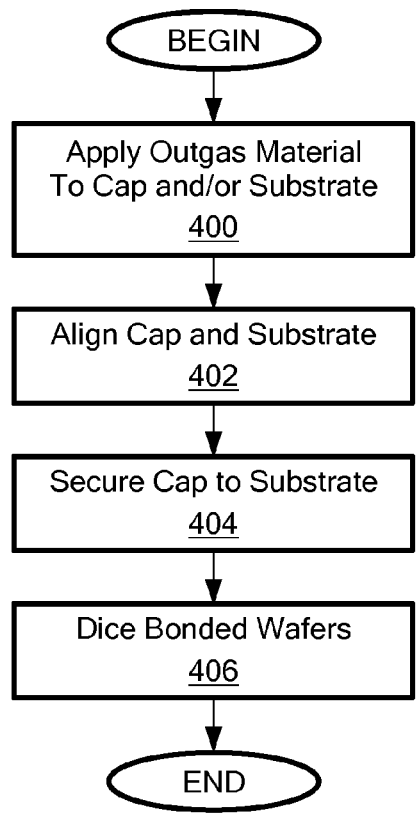
FIG. 4 shows a process of fabricating a packaged MEMS device in accordance with illustrative embodiments of the invention.

FIG. 4 shows a process of forming a multi-chamber packaged MEMS device 18 as shown in any of FIGS. 3A-3C in accordance with illustrative embodiments of the invention. It should be noted that this process is a simplified version of an actual process that has many more steps. In addition, some of the steps of the process can be performed in a different order than that disclosed, and some sequential steps can be performed at substantially the same time. Accordingly, this process is but one of many different illustrative processes that may implement various embodiments the invention.

The process practices bulk fabrication processing using a MEMS wafer with a two-dimensional array of MEMS chips 22, and a corresponding cap wafer with a two-dimensional array of caps 26. Those skilled in the art nevertheless can use this process to form one packaged MEMS device 18 at a time.

Prior to beginning this process, illustrative embodiments form the microstructure 32 on the MEMS wafer using conventional micromachining processes. In a similar manner, conventional processes form the caps 26 of the cap wafer using conventional micromachining processes.

The process begins at step 400, which applies an outgas material to prescribed portions of the cap wafer and/or the substrate wafer for form the outgas structure(s) 34. To that end, illustrative embodiments may deposit an outgas material directly onto portions of the desired surfaces. The outgas material can cover entire regions or surfaces (e.g., the entire top surface of the cap wafer), or specified portions. Alternatively, illustrative embodiments may etch cavities directly into the wall(s)/surface(s) of the cap wafer and/or MEMS wafer, and then deposit the outgas material within those cavities to form the outgas structure(s) 34. In either case, after fabrication, the outgas structure 34 remains exposed to produce the desired increased pressures. Moreover, this step of applying the outgas material may be performed at the same time as other necessary process steps (even steps not discussed) and thus, not increase the total number of steps in the process.

In some embodiments, the outgas material is applied at the same time and using the same material as another component within the MEMS chip 22. For example, the fabrication process may apply an outgas material layer to the substrate 24 (e.g., using a deposition step). If the outgas structure 34 were not to be used, then the fabrication process would remove a certain amount of the deposited outgas material, thus forming a passivation layer. To form the outgas structure 34, however, such embodiments leave behind some or all of the passivation material. Accordingly, these embodiments form the outgas structure 34 at the same time they form another structure—in this example, the outgas structure 34 is formed and deposited at the same time as a passivation layer.

After applying the outgas material and forming the outgas structure 34, the process aligns the cap wafer and the MEMS wafer (step 402) and secures the cap wafer to the MEMS wafer (step 404). To that end, conventional processes may apply a bonding material to the interface of the cap wafer and the MEMS wafer. Next, the process applies heat and pressure to form a hermetic or other seal between the cap wafer and the MEMS wafer, thus forming the individual chambers 28. Among other things, the bonding material may include a glass frit or a metal, such as aluminum, germanium, or aluminum germanium.

The alignment and securing process steps typically take place within an environment having a single pressure. For example, these steps may be performed within a wafer bonding chamber having a pressure that is less than atmospheric pressure. The outgas structure 34 thus, after some period of time, causes the interior chambers 28 to be higher than that of the bonding environment. Accordingly, illustrative embodiments deliver the capability of varying the chamber pressures without adding process steps—this step 404 simply secures the cap and MEMS wafers together in a conventional manner. In addition, the environment also may have a gas that ultimately is sealed within each chamber 28 (i.e., within a hermetic chamber 28).

The process concludes at step 406 by dicing the single wafer along prescribed paths, such as along pre-defined scribe streets, to produce the individual packaged MEMS devices 18. Indeed, the chambers 28 preferably maintain their hermeticity through dicing, testing, and through use. At some time after the securing step 404 and/or after the dicing step 406, the pressures produced by the outgas structure(s) 34 should reach a steady state pressure that is desired in the required applications. Some embodiments are expected to produce the expected steady state pressures within hours of sealing. The two chamber packaged MEMS device 18 thus may have a first chamber 28 with a low pressure, and a second chamber 28 with a higher pressure.

Certain post-processing steps can be taken on each packaged MEMS device 18. For example, the bonding process may not have sufficiently bonded one portion of the cap wafer to the MEMS wafer, which could create a catastrophic failure of chamber hermeticity. Those in the art thus may test the packaged MEMS devices 18 to confirm that they have the desired chamber pressures. These steps can be taken either before or after the dicing step 406.

Rather than using outgas structures, some embodiments simply select the internal MEMS chip materials to produce varying pressures. For example, with appropriately selected materials and geometries, a passivation layer (formed from an outgas material) in one chamber 28 can be relatively thick, while the other chamber 28 can have a relatively thin passivation layer formed from the same material. These different thicknesses can vary the pressures within their respective chambers 28. In fact, these varying pressures can vary the chamber pressures without requiring an outgas structure 34 within any part of their respective chambers 28. Again, this varying pressure can be achieved without prior art drilling and filling processes—maintaining hermeticity through dicing and testing, as well as through use.

Accordingly, illustrative embodiments selectively use outgas structure(s) 34 to produce a single packaged MEMS device 18 with varying internal pressures. Moreover, this device 18 is formed without adding further processing steps, consequently eliminating potentially damaging subsequent steps of opening up a previously sealed chamber 28 to change its pressure.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS apparatus comprising:
   a substrate;
   a cap forming first sealed chamber and a second sealed chamber with the substrate;
   movable microstructure within the first and second sealed chambers; and
   a first outgas structure within the first sealed chamber, the first outgas structure emitting a gas via outgassing to produce a first pressure within the first sealed chamber, the first sealed chamber being isolated from the second chamber,
   the second sealed chamber having a second pressure, the first pressure being different from the second pressure.

2. The MEMS apparatus as defined by claim 1, wherein the first outgas structure comprises nitride.

3. The MEMS apparatus as defined by claim 2, further comprising a second outgas structure within the second chamber configured to emit a gas via outgassing, wherein the first outgas structure and second outgas structure have different outgas rates per unit volume.

4. The MEMS apparatus as defined by claim 1 further comprising a gettering material within the second chamber, and wherein the first chamber is substantially free of gettering material.

5. The MEMS apparatus as defined by claim 1 wherein the first pressure produced by the first outgassing material is greater than the second pressure.

6. The MEMS apparatus as defined by claim 1 wherein the second chamber is substantially free of an outgas structure.

7. The MEMS apparatus as defined by claim 1 wherein the first chamber includes a sidewall surface extending between the cap and the substrate, the first outgas structure being positioned on the sidewall surface to cover at least a portion of the sidewall surface.

8. The MEMS apparatus as defined by claim 1 wherein the substrate supports the microstructure within the first chamber, the first chamber having a top portion formed by the cap, the top portion being opposed to the microstructure, the first outgas structure being positioned on a surface within the first chamber other than the top portion of the first chamber.

9. The MEMS apparatus as defined by claim 1 wherein the first chamber includes a cavity, the first outgas structure being within the cavity, the first outgas structure not securing the cap to the substrate.

10. The MEMS apparatus as defined by claim 1 wherein the substrate comprises the first outgassing material.

11. A MEMS apparatus comprising: a substrate having a substrate material; a cap forming first and second sealed chambers with the substrate, the cap having a cap material; securing material connecting the cap with the substrate; movable microstructure within the first and second chambers; and a first outgas structure formed within the first chamber, the first outgas structure emitting a gas via outgassing to produce a precise, predetermined first pressure within the first chamber, the first outgas structure comprising the same material as at least at least one of the substrate material, the cap material, and the securing material, the first chamber being isolated from the second chamber, the second chamber having a second pressure, the first pressure being greater than the second pressure.

12. The MEMS apparatus as defined by claim 11 further comprising a second outgas structure within the second chamber.

13. The MEMS apparatus as defined by claim 11 wherein the cap comprises circuitry.

14. A MEMS apparatus comprising: a substrate; a cap forming first sealed chamber and a second sealed chamber with the substrate; movable microstructure coupled to the substrate within the first and second sealed chambers; and an outgas structure secured to the substrate and within the first sealed chamber, the outgas structure emitting a gas via outgassing to produce a first pressure within the first sealed chamber, the first sealed chamber being isolated from the second chamber, the second sealed chamber having a second pressure, the first pressure being different from the second pressure.

15. The MEMS apparatus as defined by claim 14, wherein the outgas structure comprises nitride.

16. The MEMS apparatus as defined by claim 14, wherein the outgas structure comprises an oxide.

17. The MEMS apparatus as defined by claim 14, wherein the outgas structure comprises a polymer.

18. The MEMS apparatus as defined by claim 14, wherein the outgas structure comprises a metal.

19. The MEMS apparatus as defined by claim 14, wherein the second sealed chamber further comprises a gettering material directly exposed to the second sealed chamber.

20. The MEMS apparatus as defined by claim 14, wherein the second sealed chamber is substantially free of an outgas structure.

UNITED STATES PATENT AND TRADEMARK OFFICE
CERTIFICATE OF CORRECTION

| | | |
|---|---|---|
| PATENT NO. | : 9,102,512 B2 | Page 1 of 1 |
| APPLICATION NO. | : 14/045855 | |
| DATED | : August 11, 2015 | |
| INVENTOR(S) | : Christine H. Tsau et al. | |

It is certified that error appears in the above-identified patent and that said Letters Patent is hereby corrected as shown below:

In the Claims

In Col. 10, line 16
replace "at least at least one"
with --at least one--

Signed and Sealed this
Second Day of February, 2016

Michelle K. Lee
*Director of the United States Patent and Trademark Office*